United States Patent
Schwartz

(10) Patent No.: US 6,294,905 B1
(45) Date of Patent: Sep. 25, 2001

(54) METHOD AND CIRCUIT FOR CONTROLLING CURRENT IN AN INDUCTIVE LOAD

(75) Inventor: Reiner Schwartz, Grafing (DE)

(73) Assignee: STMicroelectronics GmbH, Grasbrunn (DE)

( * ) Notice: Subject to any disclaimer, the term of this patent is extended or adjusted under 35 U.S.C. 154(b) by 0 days.

(21) Appl. No.: 09/565,356

(22) Filed: May 2, 2000

(30) Foreign Application Priority Data

May 3, 1999 (DE) .............................................. 199 20 307

(51) Int. Cl.$^7$ ....................................................... G05F 1/40
(52) U.S. Cl. .............................................................. 323/288
(58) Field of Search .................................. 323/288, 284, 323/283, 282

(56) References Cited

U.S. PATENT DOCUMENTS

| | | |
|---|---|---|
| 3,970,919 | 7/1976 | Butcher . |
| 4,095,165 | 6/1978 | Boros . |
| 4,156,166 * | 5/1979 | Shapiro et al. ..................... 323/288 |
| 5,283,515 * | 2/1994 | Jordan ................................. 323/288 |
| 6,049,201 * | 4/2000 | Feldtkeller ......................... 323/288 |

OTHER PUBLICATIONS

JP 3–70464(A), Mar. 26, 1991, Patent Abstracts of Japan, E–1078, vol. 15(236).

Matsuo, H. et al., "Overcurrent Limiting Characteristics of the DC–DC Converter with a New Digital Current–Injected Control Circuit," *IEEE Transactions on Power Electronics*, 13(4):645–650, 1998, No Month.

* cited by examiner

*Primary Examiner*—Shawn Riley
(74) *Attorney, Agent, or Firm*—Theodore E. Galanthay; E. Russell Tarleton; Seed IP Law Group PLLC

(57) ABSTRACT

A control or adjusting circuit for a load, a desired signal is compared to an actual signal corresponding to the state of the load, and a PWM control signal is generated in a control signal generating circuit in accordance with the comparison result. The control signal opens and closes a current switch coupled to the load. For forming the PWM control signal, the contents of a ramp counter are compared to the contents of an up/down counter by means of a digital comparator. To obtain fast approximation of the two signals to each other in the case of strong deviations between the desired signal and the actual signal, the up/down counter is subjected to relatively rapid counting in case of high control deviations as compared to low control deviations. To this end, the up/down counter is operated with a clock signal of variable frequency that is produced by a voltage-controlled oscillator as a function of the difference between the desired signal and the actual signal.

18 Claims, 4 Drawing Sheets

METHOD AND CIRCUIT FOR CONTROLLING CURRENT IN AN INDUCTIVE LOAD

TECHNICAL FIELD

The invention relates to an electric circuit for controlling a load in accordance with a target or desired signal.

BACKGROUND OF THE INVENTION

The term "load" is to be understood in the present context in the broadest possible scope. Primarily, it is an electric load, for example an electric motor, a coil, a resistor or the like, and such electric components then may have the "load" proper coupled thereto, for example in the form of an electromagnetic valve, an electric heating or a part to be moved mechanically by an electric motor.

For illustrating the invention in representative manner, an inductive load in the form of an electromagnetic driver device for a braking valve of a brake system is to be considered specifically in the following. Such an electromagnetic driver device is concerned with controlling/adjusting the pressure of brake fluid. The pressure is adjusted by the electromagnetic valve as a function of the current flowing through the coil of the electromagnet. The control signal for such a control/closed-loop control is usually supplied to an electronic switch in the form of a PWM adjusting or control signal (PWM=Pulse Width Modulation), with this PWM control signal opening and closing the electronic switch with a specific pulse duty factor or duty cycle (ratio of pulse duration to pulse interval) so that the current flow through the electronic switch connected in series with the load determines the current flow through the load.

As with other usual closed-loop control circuits, the circuit according to the invention also employs an arrangement in which a first signal source issuing the desired signal as well as a second signal source issuing an actual signal are connected, via a control signal generating circuit, to a controller, for example the control terminal of an electronic switch (for example a MOSFET).

There are numerous possible designs for the control signal generating circuit. Decisive for the output signal of the control signal generating circuit is the deviation between actual signal and desired signal. With slight control deviation, i.e., a little difference between the actual signal and the desired signal, the control signal is of such a nature that only a relatively minor change in the quantity to be controlled or adjusted in the load is still taking place towards the desired signal. With a large control deviation, the control signal is "larger", i.e., there is a faster change of the actual signal for approximation to the desired signal.

In order to accelerate the approximation of the desired signal and the actual signal in case of large control deviations, the control signal is provided with a differential component. The control signal is thus amplified overproportionally in case of large control deviation in order to obtain an as fast as possible approximation of the actual value to the desired value.

The prior art reveals a large variety of measures for obtaining in addition to proportional control also differential and/or integral control, either alternatively or in addition thereto.

In the past few years an increasing number of digital circuits has been employed for controlling/adjusting electric loads. For producing a PWM control signal, a digital control circuit employs, for example, an up/down counter whose continuously changing count is compared to a digital periodical ramp signal. Depending on the ratio of the numerical values compared with each other, the level of the PWM control signal obtained therefrom is either high or low. The up/down counter is clocked by a constant clock signal, with the counting direction being set in accordance with the ratio between desired signal and actual signal.

SUMMARY OF THE INVENTION

It is conceivable now not to compare the count directly to the ramp signal, but to first convert the count of the counter in accordance with a predetermined function in order to thus obtain a proportional, integral or differential behavior.

The disclosed embodiments of the invention are directed to an electric circuit for controlling a load in accordance with a desired signal, in which relatively rapid approximation of the actual signal in the load to the desired signal is achieved with relatively simple means, with the speed of approximation between the actual signal and the desired signal increasing as the deviation increases.

The disclosed embodiments of the invention provide an electric circuit for controlling a load in accordance with an actual signal, said circuit comprising:

a first signal source issuing the desired signal;

a second signal source issuing an actual signal representative of the current state of the load;

a controller coupled to the load and having a control terminal, and a control signal generating circuit which at an input thereof receives a deviation signal representative of the difference between desired signal and actual signal, which generates a control signal in accordance with the deviation signal and which feeds the control signal via an output to the control terminal of the controller, the control signal generating circuit including a counter operated in accordance with the deviation signal so as to generate the control signal, and a count clock input of the counter being connected to the output of a voltage-controlled oscillator receiving the deviation signal at the input thereof.

Instead of operating the counter with a clock signal of fixed frequency or with a clock signal of a frequency derived from a fixed frequency, the counter is operated according to one embodiment or the invention with the clock signal derived from the output of a voltage-controlled oscillator.

Voltage-controlled oscillators are known in the prior art in various designs. Usually, the oscillation frequency at the output of the voltage-controlled oscillator (VCO) is dependent on the voltage difference at the input terminal pair thereof. If the voltage difference is large, the output frequency is relatively high, and with low voltage difference the output frequency is relatively low.

The present invention makes use of this special feature of a voltage-controlled oscillator in conjunction with a control or adjusting means. When the deviation between the desired signal and the actual signal is high, the voltage controlled oscillator delivers a signal of relatively high frequency at its output. The counter is operated in correspondingly rapid manner, and as a consequence thereof the control signal supplied to the control terminal of the controller is shaped such that rapid approximation of the actual signal to the desired signal takes place.

A preferred embodiment of the invention expediently employs a comparator circuit comparing the desired signal to the actual signal and forming the deviation signal at the output thereof. Instead of a separate comparator circuit, it is also possible to apply the actual signal and the desired signal directly to the two inputs of the voltage-controlled oscillator. The deviation signal then is the voltage difference between the desired signal and the actual signal.

An essential component of the circuit according to one embodiment of the invention is the voltage-controlled oscillator in conjunction with a counter. The manner in which the control signal is formed on the basis of the count is dependent upon the particular application. For example, an analog control signal is fed to the control terminal (base, gate) of a transistor. This analog control signal could be obtained by digital-to-analog conversion from the count of the counter, with the counter then being expediently designed as an up/down counter (forward-backward counter). Depending on the sign of the differential signal obtained from subtraction of the actual signal from the desired signal, the counter count is either increased or decreased, with the speed of counting, according to the invention, being dependent upon the frequency of the clock signal at the output of the voltage-controlled oscillator.

According to another embodiment of the invention, it is provided that the control signal is a PWM control signal. To this end, there is preferably provided a digital comparator having a first and a second input as well as an output, with the first input being connected to the output of the counter, the second input being connected to a reference value generator and the output of the digital comparator being connected to the control input of the controller.

Depending on the ratio of the contents of the counter to the output signal of the reference value generator, the PWM control signal is generated with a more or less high pulse duty cycle (ratio of pulse duration to pulse interval).

In another embodiment, the invention provides that a pulse shaper is connected between the voltage-controlled oscillator and the count clock input of the counter. Such a pulse shaper is adapted to improve the edges of the clock signal since the voltage-controlled oscillator (VCO) as a rule delivers an approximately sinusoidal signal.

A further embodiment of the invention provides that a monoflop is connected between the output of the digital comparator and the control terminal of the controller and that the output of the digital comparator or of the monoflop is connected to a resetting input of the counter.

With such a circuit, the pulse duration of the PWM signal is always invariably high, and just the length of the pulse interval between the individual pulses is changed, which thus causes a change in the frequency of the PWM control signal. In case of a high control deviation between the actual signal and the desired signal, the count of the counter is changed relatively rapidly due to the high frequency of the signal delivered by the VCO. Resetting of the counter thus takes place in correspondingly rapid manner. Due to the fact that with each resetting of the counter the monoflop delivers a pulse, the duty cycle of the PWM control signal increases. One thus obtains rapid approximation of the actual signal to the desired signal.

The afore-mentioned essential component of the circuit according to the invention, i.e., the voltage-controlled oscillator in conjunction with a counter, is used in a special aspect for a digital integrator.

Numerous embodiments of integrators have been developed in the past. An analog integrator contains, for example, an operational amplifier having a capacitor in the feedback branch. A digital integrator contains an analog to digital converter conerting the analog signal to be integrated into digital values and then sums up the digital signal over time.

According to the invention, the aforementioned combination of voltage-controlled oscillator and counter is employed. To this end, the invention provides a digital integrator for integrating an analog signal that includes:

an input fed with the analog signal, a voltage-controlled oscillator receiving the analog signal and generating an oscillation signal the frequency of which is dependent on the amplitude of the analog signal, and a counter receiving the oscillation signal of the voltage-controlled oscillator and issuing a digital signal at the output thereof that is representative of the integrated analog signal.

With the digital integrator of the embodiments disclosed herein, a separate analog to digital converter can be dispensed with. Due to the fact that the frequency of the output signal of the VCO is proportional to the amplitude of the input voltage of the VCO, the counter connected to the output of VCO performs counting with a speed proportional to the amplitude of the analog signal. Thus, the digital signal corresponding to the integral of the analog signal is obtained at the output of the counter.

In another embodiment, the counter is an up/down counter receiving, at a counting direction input, a sign signal that has been derived from the analog signal having a sign associated therewith.

BRIEF DESCRIPTION OF THE DRAWINGS

Embodiments of the invention shall now be elucidated in more detail by way of the drawings in which.

DETAILED DESCRIPTION OF THE INVENTION

Figure 1:
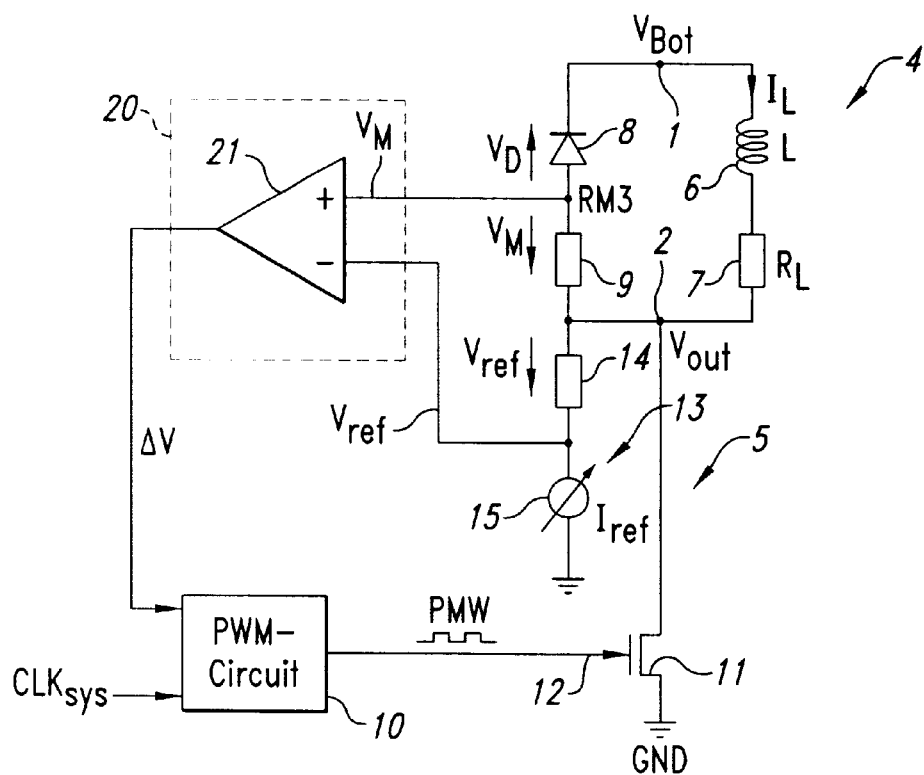
FIG. 1 is a circuit sketch of an electric circuit for controlling an inductive load in accordance with the a first embodiment of the invention.
Figure 2:
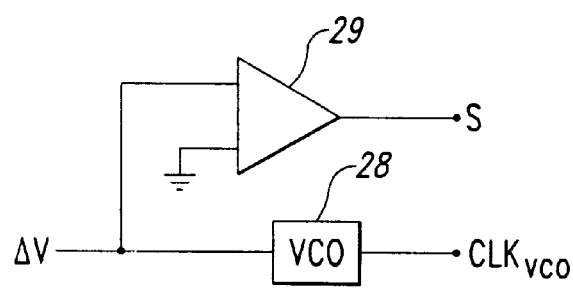
FIG. 2 is a block diagram of a part of the circuit of the first embodiment of the invention according to FIG. 1.

FIGS. 1 and 2 show a first embodiment of the circuit according to the invention for controlling a load. The circuit shown in the right-hand part of FIG. 1 contains a first circuit branch 4 with an inductive load 6 to be controlled and an associated ohmic resistor 7, a second circuit branch 3 with a flyback diode 8 and a measuring resistor 9 (RM3), as well as a third circuit branch 5 with an electronic switching element 11. Switching element 11 in the instant case is, for example, a MOSFET having a control terminal 12.

Circuit branches 4 and 3 are arranged parallel to each other between a first terminal 1 ($V_{Bat}$) and a second terminal 2 ($V_{out}$), and the third circuit branch 5 is located between second terminal 2 and a third terminal GND (ground).

For controlling the current in the inductive load containing the inductance 6 with a value L and an ohmic resistance component with a value $R_L$, the current flow through the load is activated and deactivated in accordance with a PWM control signal at control terminal 12 of current switch 11. Upon deactivation of current switch 11, the current flow through the third circuit branch 5 is blocked. Due to the energy stored in the inductance, current $I_L$ now flows through second circuit branch 3 since, and as long as, the circuit at second terminal 2, i.e., $V_{out}$, is higher than voltage $V_{Bat}$ (the forward voltage of flyback diode 8 is not considered here). The flyback current through the then open flyback diode 8 also flows through measuring resistor 9 or RM3 and leads to a measurement voltage $V_M$.

Connected to second terminal 2 is a fourth circuit branch 13 containing a variable current source 15 and a reference resistor 14. Current source 15 delivers an adjustable reference current Iref resulting in a voltage Vref at reference resistor 14. The measurement voltage $V_M$ and the reference voltage Vref are fed to a comparator 20 which in the instant case contains a differential amplifier 21, with the measurement voltage $V_M$ being fed to the non-inverting input whereas the reference voltage Vref is fed to the inverting input.

In accordance with FIG. 2, a sign signal S of either high or low level is formed from the output signal ΔV of the comparator by means of an operational amplifier 29. The level indicates whether signal $V_M$ is greater than Vref, or vice versa. Sign signal S is formed in a PWM circuit 10 which in addition generates an input clock signal $CLK_{VCO}$ by means of a voltage-controlled oscillator (VCO) 28. The clock signal $CLK_{VCO}$ determines the duty cycle of the PWM control signal at the output of PWM circuit 10 which is supplied to control terminal 12 of current switch 11.

The mode of operation of the circuit according to FIGS. 1 and 2 shall be elucidated in the following.

A clock signal $CLK_{sys}$ at the input of PWM circuit 10 has a fixed period duration which determines the period duration of the PWM control signal at terminal 12 of current switch 11.

While current switching element 11 is blocked and current $I_L$ flows through the second circuit branch 3, this current $I_L$ and thus the measurement voltage $V_M$ decrease gradually. When the value of the measurement voltage $V_M$ reaches the value of reference voltage Vref, the sign conditions at the two inputs of comparator 20 change so that as a consequence thereof the level of the deviation signal ΔV appearing at the output of the comparator changes. Due to this level change, PWM control signal is changed whereby current switching element 11 is opened. This causes an instantaneous decrease of the voltage Vout at second terminal 2 to zero (strictly speaking to approx. zero, considering the closing resistance Ron of current switching element 11).

While the current switching element is opened, current flows through first current branch 4, with the current intensity gradually increasing. In case of a too high current in inductive load 6, a longer period of time is required due to the then higher measurement voltage $V_M$ until voltage $V_M$ has decreased to the value of Vref.

Figure 3:
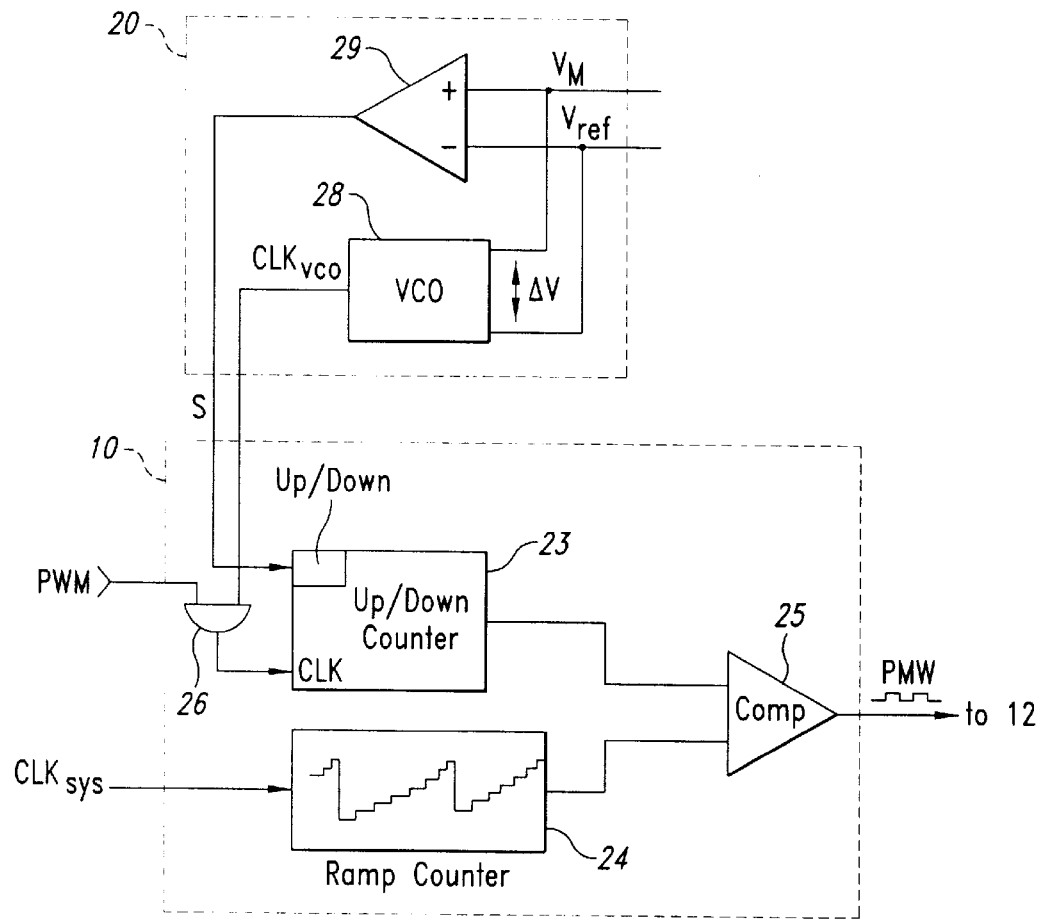
FIG. 3 is a block diagram of a second embodiment of the circuit according to the invention.

FIG. 3 illustrates a second embodiment of the circuit according to the invention. In this embodiment, PWM circuit 10 contains an up/down counter 23 having an up/down setting input, to which the sign signal S from comparator 20 is fed, a clock input and an output connected to an input of a digital comparator (Comp) 25, and contains furthermore a ramp counter 24 connected to a second input of digital comparator 25, as well as an AND gate 26.

The circuit components depicted in FIG. 3 are components known per se, the function of which is known to the expert. Input signal $CLK_{sys}$ is supplied to the clock input of the ramp counter so that the ramp counter counts up from zero to its maximum value relatively rapidly and in doing so generates a digital ramp signal at its output. Upon expiration of a period duration dependent on the clock frequency and the number of digits of the counter, the counter again starts up-counting from zero. Clock signal $CLK_{VCO}$ is fed to the clock input of up/down counter 23. The AND gate 26 is opened by the inverted PWM control signal.

The count of up/down counter 23 slowly changes in an up or down direction as a function of the change of the sign signal S. In the case of equality between the output signal of up/down counter 23 and the rapidly changing ramp signal at the output of ramp counter 24, switching over of the level at the output of digital comparator 25 takes place, thereby forming the PWM control signal for control terminal 12 of current switching element 14.

Ramp counter 24 of PWM circuit 10 according to FIG. 3 is fed with a system clock signal $CLK_{sys}$, which has a constant frequency of 4 kHz, for example.

Up/down counter 23 of PWM circuit 10 is fed with the clock signal of variable frequency $CLK_{VCO}$. To this end, comparator 20 according to FIG. 3, in addition to OP amplifier 29 delivering sign signal S, contains moreover a voltage-controlled oscillator (VCO) 28 (contained in PWM circuit 10 in the embodiment according to FIGS. 1 and 2), which receives as input voltage the differential voltage of measurement voltage $V_M$ and reference voltage Vref and in accordance with this differential voltage delivers an output oscillation signal or output pulse signal of variable frequency. In the case of a great difference between $V_M$ and Vref, the frequency of output signal $CLK_{VCO}$ of VCO 28 is relatively high, so that accordingly—with AND gate 26 opened—up/down counter 23 counts relatively rapidly (either up or down, depending on sign signal S). Upon approximation of both voltages $V_M$ and Vref to each other, the frequency of clock signal $CLK_{VCO}$ at the output of VCO 28 decreases, so that up/down counter 23 counts correspondingly slower. This course of operation means that, with strong control deviation, up/down counter counts very fast, i.e., provides for rapid approximation of the actual current value to the desired current value, whereas with low control deviation correspondingly slow adjustment control is carried out, whereby overshooting is avoided or kept low.

Figure 4:
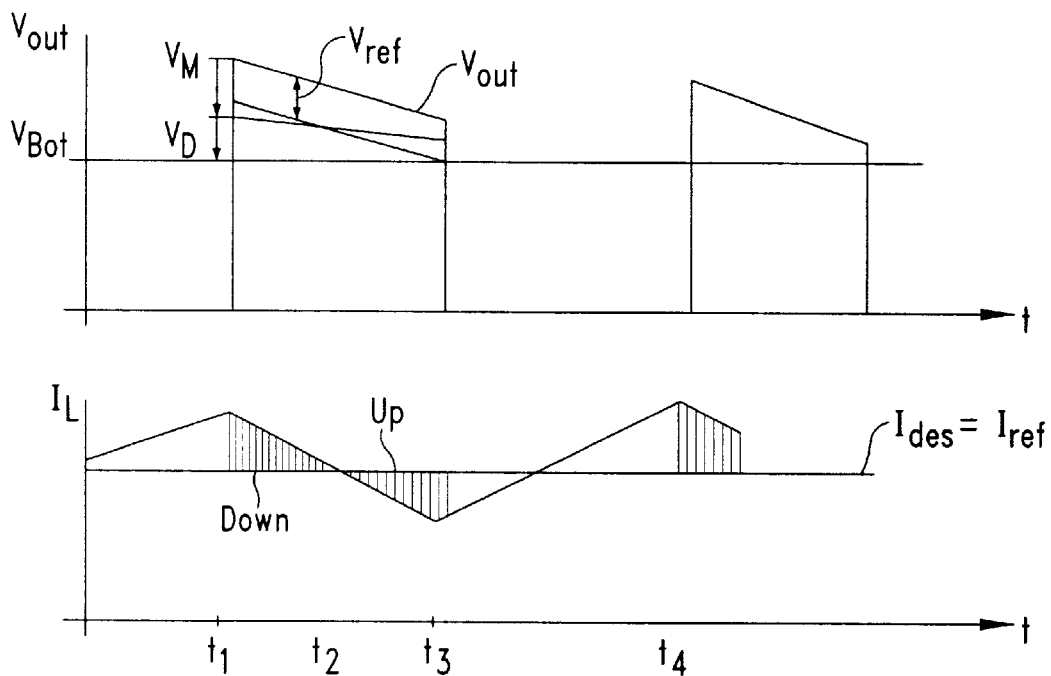
FIG. 4 is a pulse diagram illustrating the control behavior of the circuit arrangement according to FIG. 3.

For elucidating the operation of the circuit of the embodiment according to FIG. 3, reference shall be made to FIG. 4. Voltage Vout changes suddenly as current switch 11 is opened and closed. Current $I_L$ to be controlled varies around the desired current which corresponds to reference current Iref. In the interval between the times t1 and t2, down-counting takes place in accordance with sign signal S. In the following interval between times t2 and t3, up-counting takes place. The change of the counting direction in up/down counter 23 is dependent on the moment of time at which measurement voltage $V_M$ is equal to reference voltage Vref. The upper line in FIG. 4 shows the forward voltage of the diode, $V_D$.

Figure 5:
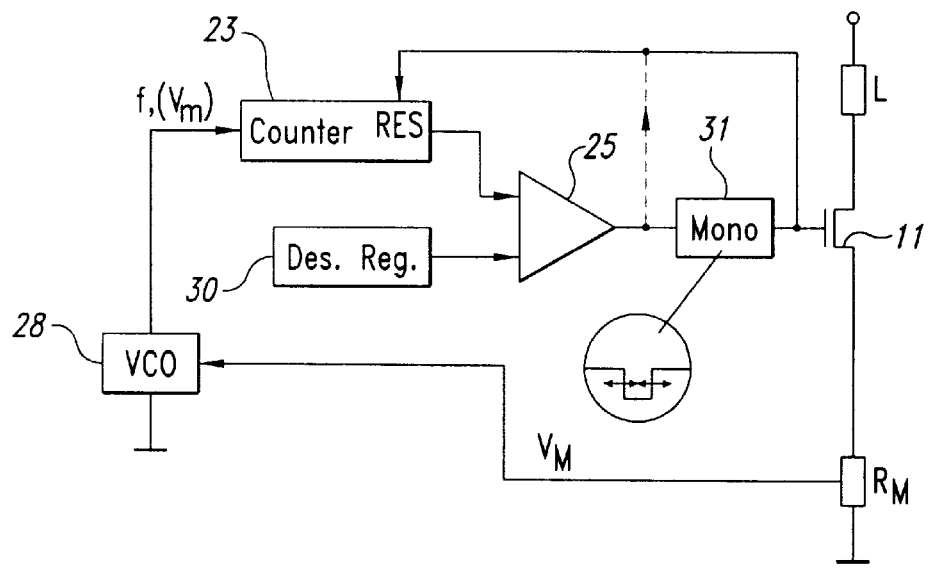
FIG. 5 is a block diagram of a third embodiment of the invention.

FIG. 5 illustrates a third embodiment of the circuit according to the invention for regulating a load. As with the preceding embodiments, the actual signal is represented by voltage Vm (measurement voltage). The desired signal corresponds to reference voltage Vref. Voltage Vm is applied to VCO 28 which in accordance with the voltage issues an output signal of a frequency f (Vm) to a counter 23 whose output is connected to an input of digital comparator 25. The other input of digital comparator 25 has the output signal of a desired value register 30 applied thereto. Counter 23 is subjected to up-counting with the clock signal of frequency f (Vm) by the output signal of VCO 28. Upon conformity of the contents of counter 23 and the contents of register 30, the level of the output signal of digital comparator 25 changes, and since the output of digital comparator 25 is connected to the resetting input (RES) of counter 23, counter 23 is reset to zero in order to start up-counting anew. Due to the reset contents of counter 23, the output signal of digital comparator 25 also is reset. The output signal of digital comparator 25 is passed to a monoflop 31 delivering a PWM control signal. The higher the voltage Vm at input of VCO 28, the higher the frequency f (Vm) and the faster the upcounting of counter 23. The interval up to the next change of the output signal of digital comparator 25 thus is only correspondingly short as well. The pulse intervals of the PWM control signal thus are relatively short if the voltage at the input of VCO 28 is relatively high.

Instead of resetting counter 23 with the output signal of digital comparator 25, it is also possible to use therefor the output signal of monoflop 31.

Figure 6:
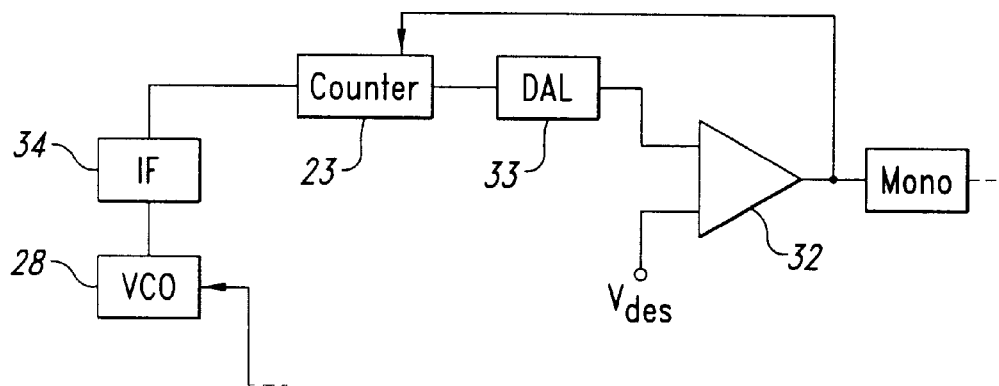
FIG. 6 is a block diagram of a fourth embodiment of the invention.

FIG. 6 shows a fourth embodiment of the invention that is modified with respect to the embodiment according to FIG. 5. Instead of the desired value register 30 shown in FIG. 5, a second reference voltage $V_{des}$ is fed to an input of a comparator 32 which is in the form of an analog comparator. The other input of analog comparator 32 receives the output signal of a digital-to-analog converter (DAC) 33 converting the count of counter 23 to an analog signal.

Between VCO 28 and counter 23, there is provided a pulse shaper 34 which may also be provided in the FIG. 5 embodiment for pulse shaping of the output signal of VCO 28. In contrast to the embodiment of FIG. 5, the fourth embodiment according to FIG. 6 employs a comparison of two analog values. As for the rest, the circuit according to FIG. 6 operates in the same manner as the circuit according to FIG. 5.

Figure 7:
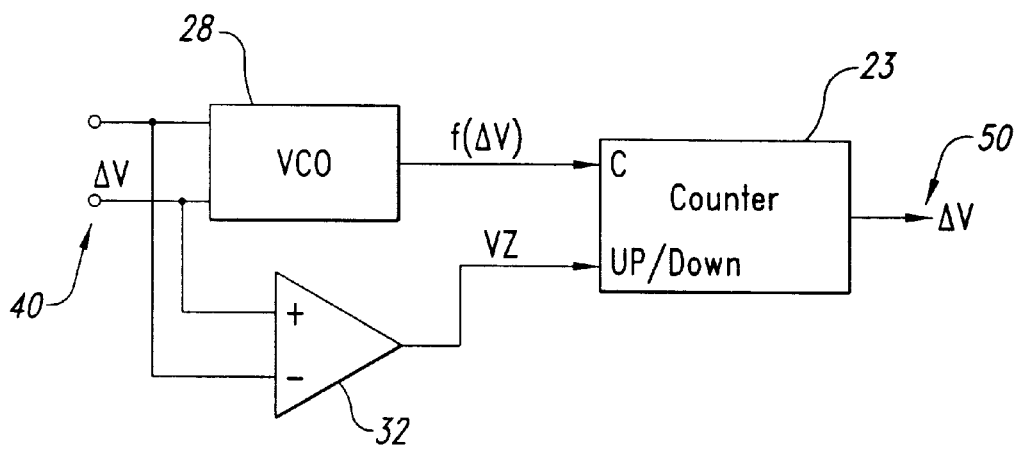
FIG. 7 is a block diagram of a fifth embodiment of the invention in the form of an integrator.

A further embodiment of the invention is depicted in FIG. 7. FIG. 7 shows a digital integrator having an input 40 and an output 50. Input 40 has an analog signal ΔV applied thereto, and at output 50 there is produced a digital signal corresponding to the integral of analog signal ΔV. This circuit may also be used for controlling a load, however, without the invention being restricted to such a possibility of use. In the digital integrator shown in FIG. 7, voltage-controlled oscillator (VCO) 28, in accordance with the amplitude of input signal ΔV, forms an oscillation signal f (ΔV) which is applied to counting input C of up/down counter 23. In addition thereto, a sign generator 32 generates from the sign-defined analog signal ΔV a sign signal Vz, for example of positive level for a positive sign of analog signal ΔV and zero level for a negative analog signal. Signal Vz at the up/down input of counter 23 determines the counting direction of the counter. Due to the fact that the frequency f of the output signal of VCO 28 is proportional to the amplitude of voltage ΔV, a signal corresponding to the count is obtained at the output of counter 23, which represents the digital value of the integral of analog voltage ΔV.

What is claimed is:

1. An electric circuit for controlling a load in accordance with a desired signal, said circuit comprising:
   a first signal source issuing the desired signal;
   a second signal source issuing an actual signal representative of the current state of the load;
   a controller coupled to the load and having a control terminal; and
   a control signal generating circuit which at an input thereof receives a deviation signal representative of the difference between the desired signal and the actual signal, which generates a PWM control signal in accordance with the deviation signal and which feeds the control signal via an output to the control terminal of the controller, the control signal generating circuit including a counter operated in accordance with the deviation signal so as to generate the PWM control signal, and a count clock input of the counter being connected to the output of a voltage-controlled oscillator receiving the deviation signal at the input thereof.

2. The circuit of claim 1,
   further comprising a comparator circuit configured to compare the desired signal to the actual signal and to generate the deviation signal at the output thereof.

3. The circuit of claim 1,
   wherein a digital comparator is provided having a first and a second input and an output, the first input connected to the output of the counter, the second input connected to a reference value generator, and the output connected to the control input of the controller.

4. The circuit of claim 1,
   wherein a pulse shaper is connected between the voltage-controlled oscillator and the count clock input of the counter.

5. The circuit of claim 3,
   wherein a monoflop is connected between the output of the digital comparator and the control terminal of the switching element, and wherein the output of the digital comparator or of the monoflop is connected to a resetting input of the counter.

6. A digital integrator for integrating an analog signal, comprising:
   an input fed with the analog signal;
   a sign generator receiving the analog signal and generating a sign signal;
   a voltage-controlled oscillator receiving the analog signal and generating an oscillation signal the frequency of which is dependant on the amplitude of the analog signal; and
   an up/down counter receiving the sign signal and the oscillation signal of the voltage-controlled oscillator and issuing an up-counting or down-counting digital signal at the output thereof in accordance with the sign signal and that is representative of an integration of the analog signal.

7. A method for controlling current in an inductive load, comprising:
   generating an actual current signal corresponding to the state of the current in the inductive load;
   comparing the actual current signal to a reference signal and generating a comparison signal;
   generating a PWM control signal to a control switch coupled to the inductive load using a counter that is responsive to the comparison signal to control the current in the inductive load.

8. The method of claim 7 wherein generating the control signal comprises:
   receiving the comparison signal;
   generating a counter signal of variable speed in response to the comparison signal and generating a ramp counter signal in response to a fixed clock signal, the direction of the counter signal dependent on the sign of the comparison signal; and comparing the counter signal to the ramp counter signal and generating a PWM signal as the control signal.

9. The method of claim 8 comprising increasing the speed of the counter signal as the difference between the actual current signal and the reference signal increases.

10. The method of claim 8 wherein generating a variable-speed counter signal comprises generating a clock signal of variable frequency produced by a voltage-controlled oscillator as a function of the difference between the actual current signal and the reference signal, and clocking an up/down counter with the variable-frequency clock signal to output the variable-speed counter signal.

11. A circuit for controlling current in an inductive load in accordance with a desired signal, the circuit comprising:
   a first signal source issuing the desired signal;
   a second signal source issuing an actual signal representative of the current state of the inductive load;
   a controller coupled to the inductive load and having a control terminal; and
   a control signal generating circuit having an input configured to receive a deviation signal representative of the difference between the desired signal and the actual signal, the control signal generating circuit configured to generate a PWM control signal in accordance with the deviation signal and that feeds the control signal via an output of the control terminal of the controller, the control signal generating circuit including an up/down counter operated in accordance with the deviation signal to generate the PWM control signal, a count clock input of the counter being connected to the output of a voltage-controlled oscillator receiving the deviation signal at the input thereof, the up/down counter configured to generate the PWM control signal in an up-direction or a down-direction, respectively, as determined by the sign of the deviation signal.

12. The circuit of claim 1, further comprising a comparator circuit configured to compare the desired signal to the actual signal and to generate the deviation signal at the output thereof.

13. The circuit of claim 12, wherein a digital comparator is provided having a first and a second input and an output, the first input connected to the output of the counter, the second input connected to a reference value generator, and the output connected to the control input of the controller.

14. The circuit of claim 11, wherein a pulse shaper is connected between the voltage-controlled oscillator and the clock count input of the counter.

15. The circuit of claim 14, wherein a monoflop is connected between the output of the digital comparator and the control terminal of the switching element, and wherein the output of the digital comparator or of the monoflop is connected to a resetting input of the counter.

16. A circuit for controlling current in an inductive load in accordance with a desired signal, the circuit comprising:
   a first signal source issuing the desired signal;
   a second signal source issuing an actual signal representative of the current state of the load;
   a controller coupled to the load and having a control terminal;
   a control signal generating circuit having an input configured to receive a deviation signal representative of the difference between the desired signal and the actual signal, the control signal generating circuit configured to generate a PWM control signal in accordance with the deviation signal and which feeds the control signal via an output to the control terminal of the controller, the control signal generating circuit including a counter operated in accordance with the deviation signal so as to generate the PWM control signal, and a count clock input of the counter connected to the output of a voltage-controlled oscillator receiving the deviation signal at the input thereof; and
   a digital comparator having a first and a second input and an output, the first input connected to the output of the counter, the second input connected to a reference value generator, and the output connected to the control input of the controller, the reference value generator comprising a ramp counter.

17. The circuit of claim 16, further comprising a pulse shaper connected between the voltage-controlled oscillator and the clock input of the counter.

18. The circuit of claim 17, wherein a monoflop is connected between the output of the digital comparator and the control terminal of the switching element, and wherein the output of the digital comparator or of the monoflop is connected to a resetting input of the counter.

* * * * *

UNITED STATES PATENT AND TRADEMARK OFFICE
CERTIFICATE OF CORRECTION

PATENT NO.   : 6,294,905 B1
DATED        : September 25, 2001
INVENTOR(S)  : Reiner Schwartz It is certified that error appears in the above-identified patent and that said Letters Patent is hereby corrected as shown below:

<u>Title page,</u>
Item [75], the inventor's residence should read -- Forstinning (DE) --.

Signed and Sealed this

Twenty-sixth Day of November, 2002

Attest:

JAMES E. ROGAN
Attesting Officer                    Director of the United States Patent and Trademark Office